US010181629B2

(12) United States Patent
Anegawa et al.

(10) Patent No.: US 10,181,629 B2
(45) Date of Patent: Jan. 15, 2019

(54) MARCHAND BALUN

(71) Applicant: Sumitomo Electric Industries, Ltd., Osaka-shi (JP)

(72) Inventors: Osamu Anegawa, Yokohama (JP); Tsuneo Tokumitsu, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/440,117

(22) Filed: Feb. 23, 2017

(65) Prior Publication Data

US 2017/0250668 A1 Aug. 31, 2017

(30) Foreign Application Priority Data

Feb. 26, 2016 (JP) ................................. 2016-036215
Oct. 20, 2016 (JP) ................................. 2016-205865

(51) Int. Cl.
*H03H 7/42* (2006.01)
*H01P 5/10* (2006.01)
*H01P 5/18* (2006.01)

(52) U.S. Cl.
CPC ................ *H01P 5/10* (2013.01); *H01P 5/187* (2013.01)

(58) Field of Classification Search
CPC ................................. H01P 1/10; H03H 7/422
USPC ........................................................... 333/25
See application file for complete search history.

(56) References Cited

U.S. PATENT DOCUMENTS 5,497,137 A * 3/1996 Fujiki ................ H01F 17/0006 333/26
5,742,901 A 4/1998 Nishida
5,949,297 A 9/1999 Nishida
6,150,897 A * 11/2000 Nishikawa ................ H01P 5/10 333/26
6,483,415 B1 * 11/2002 Tang .................. H01F 17/0013 333/26
7,068,122 B2 * 6/2006 Weng ........................ H01P 5/10 333/246
7,250,828 B2 * 7/2007 Erb ........................... H01P 5/10 333/24 R
7,302,249 B1 * 11/2007 Fudem ...................... H01P 5/10 333/26

(Continued)

FOREIGN PATENT DOCUMENTS

JP 10-013156 A 1/1998
JP 2014-204381 A 10/2014

OTHER PUBLICATIONS

Ching-Ian-Shie et al., a Miniaturized Microstrip Balun Constructed With Two 1/8 Coupled Lines and a Redundant Line, Dec. 2010, IEEE, vol. 20 No. 12, 3 pages.*

*Primary Examiner* — Dean Takaoka

(74) *Attorney, Agent, or Firm* — Venable LLP; Michael A. Sartori; Laura G. Remus

(57) ABSTRACT

A marchand balun with a reduced plane size is disclosed. The marchand balun provides two coupling units each having two transmission lines coupled to each other and having a length of λ/8, where λ is a characteristic wavelength of a signal subject to the marchand balun. The marchand balun further provides an additional unit, where two coupling unit and the additional unit are connected in series to each other. The additional unit is one of a transmission line with a length of λ/16 with one open end and a capacitor with one grounded end.

10 Claims, 19 Drawing Sheets

(56) References Cited

U.S. PATENT DOCUMENTS 7,880,557 B2 * 2/2011 Jiang .................... H03D 7/1408
333/116

* cited by examiner

MARCHAND BALUN

BACKGROUND OF THE INVENTION

1. Field of the Invention

The present invention relates to a marchand balun.

2. Related Background Arts

A marchand balun has been known as a passive device using transmission lines having a quarter wavelength (λ/4). Japanese Patent Applications laid open No. H10-013156A and 2014-204381 have disclosed details of marchand baluns for converting between a balanced signal and unbalanced signals. However, because of implementing four λ/4 transmission lines, a marchand balun usually has an enlarged size.

SUMMARY OF INVENTION

An aspect of the present invention relates to a marchand balun that may reduce a plane size thereof. The marchand balun of the invention provides an unbalanced terminal and two balanced terminals and converts a signal with a specific wavelength of λ between an unbalanced mode at the unbalanced terminal and a balanced mode at the balanced terminals. The marchand balun comprises a first coupling unit, a second coupling unit, and an additional unit. The first coupling unit includes a first transmission line and a second transmission line coupled with the first transmission line. The first transmission line has an end and another end where the end is connected to the unbalanced terminal. The second transmission line has a grounded end and another end connected to one of the balanced terminals. The second coupling unit includes a third transmission line and a fourth transmission line coupled with the third transmission line. The third transmission line has an end and another end, where the end of the third transmission line is connected to the other end of the first transmission line in the first coupling unit. The fourth transmission line has a grounded end and another end connected to the other of the balanced terminals. The additional unit has connected to the other end of the third transmission line. A feature of the marchand balun of the present invention is that the first to fourth transmission lines in the first unit and the second unit have a length longer than λ/16 but shorter than 3λ/16. The additional unit may be a transmission line with one end connected to the other end of the third transmission line, while, another end thereof is opened. In another embodiment, the additional unit may be a capacitor connected between the other end of the third transmission line and the ground.

BRIEF DESCRIPTION OF THE DRAWINGS

The invention will now be described by way of example only with reference to the accompanying drawings in which:

FIG. 12A shows transmission characteristics of the marchand balun of the comparable example, while.

FIG. 15A shows magnitudes of the reflection $S_{11}$ at the unbalanced terminal, while.

DESCRIPTION OF EMBODIMENT

Figure 1:
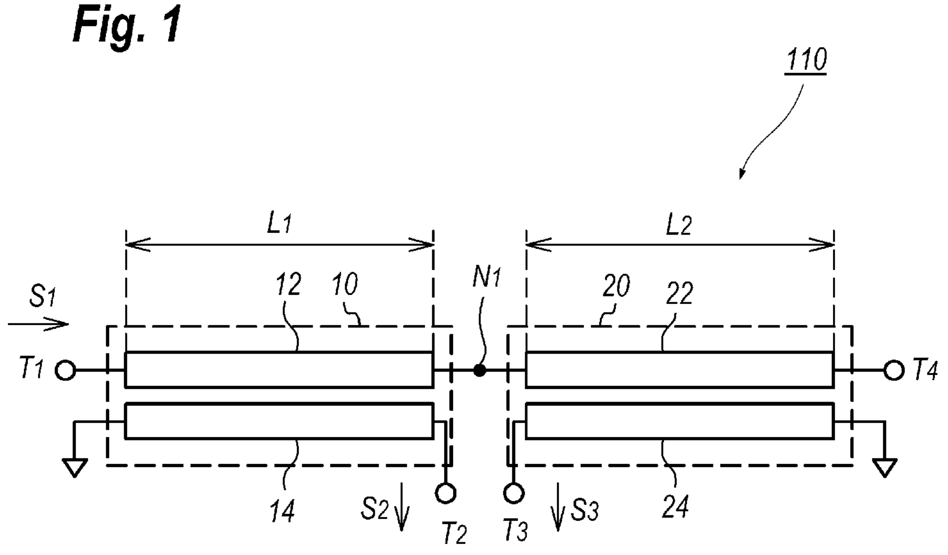
FIG. 1 schematically illustrates a marchand balun according to an example comparable to the present invention.

An example comparable to the present invention will be first described. FIG. 1 schematically illustrates a marchand balun comparable to the present invention. The marchand balun 110 includes two coupling units, 10 and 20, where the former coupling unit 10 includes two transmission lines, 12 and 14, extending in parallel and coupling in capacitive to each other. Also, the other coupling unit 20 includes two transmission lines, 22 and 24, extending in parallel and coupling in capacitive to each other.

In the first coupling unit 10, the transmission line 12 in one end thereof is coupled with an unbalanced terminal $T_1$, while, another end thereof is coupled with an intermediate node $N_1$. The other transmission line 14 in one end thereof is grounded, while, another end is coupled to one of balanced terminals $T_2$. In the second coupling unit 20, the transmission line 22 in one end thereof is connected to the intermediate node $N_1$, while, the other end is opened at a terminal $T_4$. The other transmission line 24 in one end thereof is grounded, while, the other end is connected to another of the balanced terminal $T_3$.

The coupling units, 10 and 20, exactly, the transmission lines, 12 and 14 in the coupling unit 10, and the transmission lines, 22 and 24, in the other coupling unit 20, have a length of a quarter wavelength (λ/4) for a high radio frequency (RF) signal subject to the marchand balun 110. An explanation below assumes that the a high frequency signal $S_1$ enters from the unbalanced terminal $T_1$ and two balanced terminals, $T_2$ and $T_3$, output respective signals, $S_2$ and $S_3$, complementary to each other, and an intermediate node $N_1$ connecting the transmission lines, 12 and 22, has a length enough shorter than λ/4, that is, enough shorter than the length of the transmission lines, 12 and 22.

Because the transmission lines, 12 and 14, couple in capacitive and have a λ/4 length, the signal $S_2$ output from the balanced terminal $T_2$ has a phase rotated by 90° with respect to the signal $S_1$ entering the unbalanced terminal $T_1$. On the other hand, a signal passing two transmission lines, 12 and 22, and reaching the open terminal $T_4$ has a phase rotated by 180° with respect to the signal $S_1$. Because the transmission lines, 22 and 24, couple in capacitive have the length of λ/4, and the terminal $T_4$ is opened, the signal reaching the terminal $T_4$ is fully reflected at the terminal $T_4$ and output from the other of the balanced terminal $T_3$ as rotating a phase thereof by 90°. Accordingly, the signal $S_3$ output from the terminal $T_3$ has a phase rotated by 270° with respect to the signal $S_1$. Thus, the signals, $S_2$ and $S_3$, have phases opposite to each other. When two signals, $S_2$ and $S_3$, complementary to each other enter the balanced terminals, $T_2$ and $T_3$, the unbalanced terminal $T_1$ may output an unbalanced signal $S_1$ therefrom.

Figure 2:
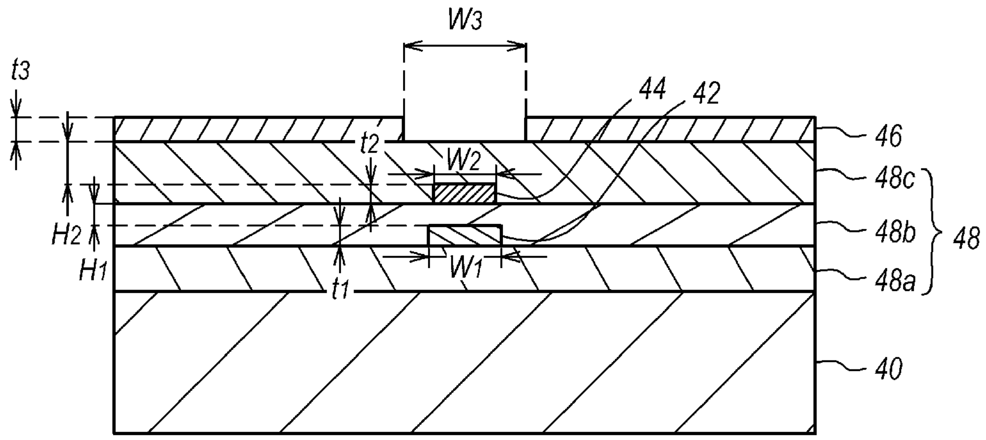
FIG. 2 shows a cross section of the marchand balun shown in FIG. 1.

Various S-parameters, namely, $S_{21}$ for transmission from the unbalanced terminal $T_1$ to the balanced terminal $T_2$, $S_{31}$ for transmission from the unbalanced terminal $T_1$ to the balanced terminal $T_3$, and $S_{11}$ for reflection at the unbalanced terminal $T_1$, are evaluated within the present specification. FIG. 2 shows a cross section of the coupling units, 10 and 20, in the marchand balun shown FIG. 1 of the comparable example and that of the present invention shown in FIG. 4 or else. The marchand balun 110 of the comparable example and those, 100 and 102, of the present invention provide, on a substrate 40 made of gallium arsenide (GaAs), an insulating layer 48 including layers, 48a to 48c. The first layer 48a is provided on the substrate 48. The second layer 48b involves a metal layer 42 that is in contact to the first layer 48a but not exposed on a surface of the second layer 48b, and the third layer 48c involves another metal layer 44 that is in contact to the second layer 48b but not exposed on a surface of the third layer 48c. The third layer 48c provides a metal film 46 on a top thereof as forming a gap in a portion overlapping with the metal layers, 44 and 42. That is, the second and first metal layers, 44 and 42, are formed beneath the gap of the metal film 46. The third metal film 46 on the top of the third layer 48c provides the ground. On the other hand, the metal layer 42 forms the transmission lines, 12 and 22, while, the other metal layer 44 forms the transmission lines, 14 and 24. That is, two metal layers, 42 and 44, couple in capacitive by interposing the second insulating layer 48b therebetween. Thus, the transmission lines, 12 to 24, formed by the metal layers, 42 and 44, show characteristic impedance of 50Ω against the metal film 46 that is grounded. The S-parameters of the coupling units, 10 and 20, based on dimensions shown in the table below:

| | |
|---|---|
| metal layer 42 | |
| width $W_1$ | 12 μm |
| thickness $t_1$ | 1 μm |
| metal layer 44 | |
| width $W_2$ | 9 μm |
| thickness $t_2$ | 1 μm |
| metal film 46 | |
| thickness $t_3$ | 2 μm |
| gap $W_3$ | 24 μm |
| gap $H_1$ between metals 42 and 44 | 2 μm |
| gap $H_1$ between metals 44 and 46 | 4 μm |
| Insulating layer | |
| dielectric constant ε | 3.0 |
| length of transmission lines, $L_1$ and $L_2$ | 400 μm |

In the table above, the length of 400 μm for the transmission lines, $L_1$ and $L_2$, corresponds to a quarter wavelength λ/4 of the frequency of 80 GHz at which the evaluation of the marchand balun is carried out.

Figure 3A:
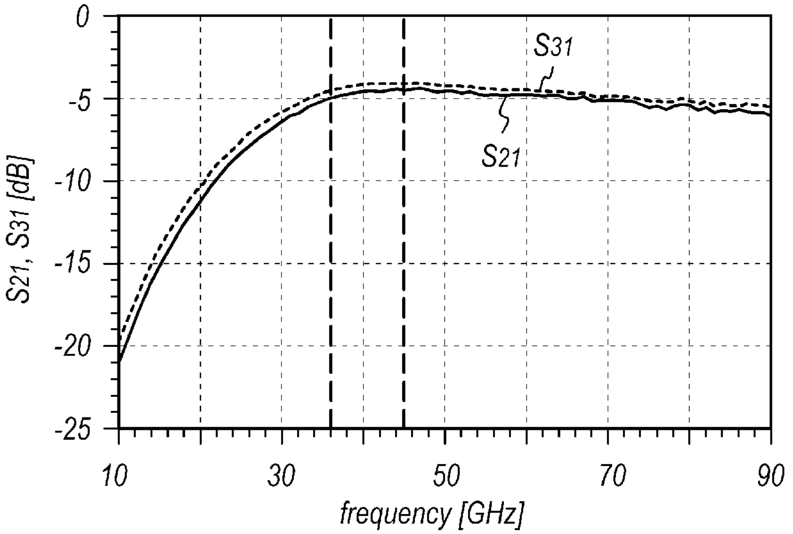
FIGS. 3A and 3B show s-parameters of $S_{21}$ and $S_{31}$ in FIG. 3A and $S_{11}$ in FIG. 3B of the marchand balun shown in FIG. 1.
Figure 3B:
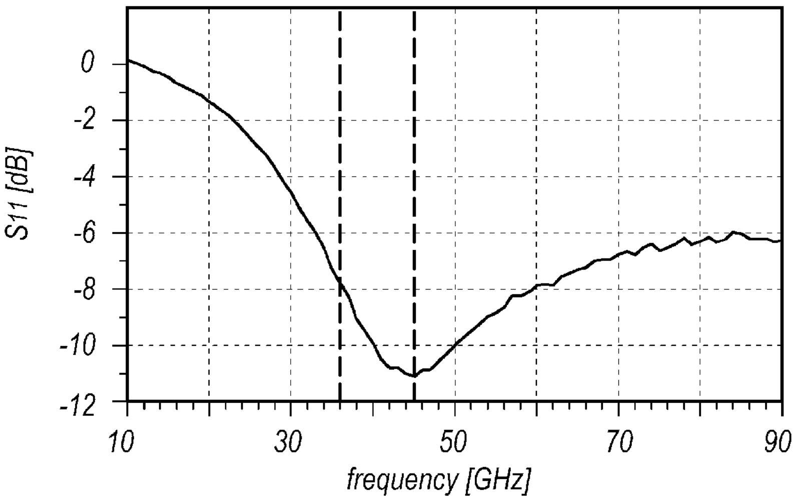

FIGS. 3A and 3B show the S-parameters for the comparable example. The transmission, $S_{21}$ and $S_{31}$, indicates moderate loss around −5 dB in frequencies of 35 to 45 GHz. Thus, the arrangement of the transmission lines, 12 to 24, of the comparable example for the frequency 80 GHz may be used as a marchand balun for a frequency of 40 GHz. As well known, a marchand balun including four transmission lines each having a length of λ/4 inevitably enlarges dimensions thereof. In particular, a marchand balun used in relatively lower frequencies becomes extraordinary larger because of an elongated characteristic wavelength of a signal subject to the marchand balun. Using a marchand balun for a frequency of 80 GHz in a frequency of 40 GHz, which is a half of the frequency specific to the marchand balun; a marchand balun may make the dimensions thereof small because the length of the coupling transmission lines has a λ/8 wavelength. However, as shown in FIG. 3B, such a marchand balun degrades the reflection $S_{11}$ in lower frequencies. For instance, the reflection $S_{11}$ at 35 GHz becomes −7 dB, which makes hard to use such a marchand balun designed at 80 GHz in a frequency of 40 GHz.

First Embodiment

Figure 4:
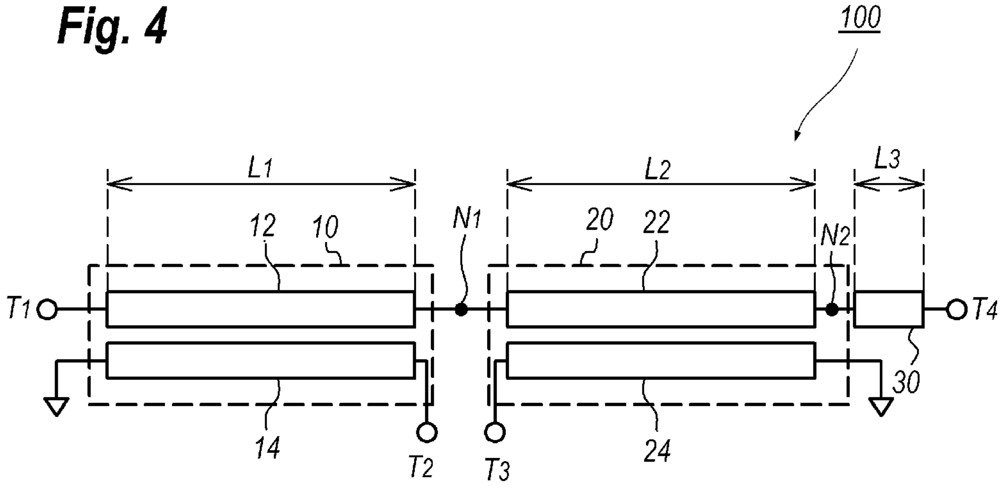
FIG. 4 schematically illustrates a marchand balun according to the first embodiment of the present invention.

FIG. 4 schematically shows a marchand balun according to the first embodiment of the present invention. The marchand balun 100 shown in FIG. 4 provides an additional transmission line 30 with a length $L_3$ between a node $N_2$ of the end of the transmission line 22 and the open terminal $T_4$. The coupling transmission lines, 12 to 24, have lengths, $L_1$ and $L_2$ of a λ/8, where λ is a characteristic wavelength of a signal subject to the marchand balun 100.

The transmission, $S_{21}$ and $S_{31}$, from the unbalanced terminal $T_1$ to the balanced terminals, $T_2$ and $T_3$, respectively, and the reflection $S_{11}$ at the unbalanced terminal $T_1$ are evaluated at a frequency around 40 GHz assuming that a length $L_3$ of the additional transmission line 30 to be 400 μm, which is λ/16 for the signal with the frequency of 40 GHz, and a width of 10 μm, where the additional transmission line 30 has no gap in the top metal film 46. Accordingly, the additional transmission line 30 has the width slightly narrower than the width of the first metal layer 42 accompanied with the gap in the top metal film 46. Thus, the additional transmission line 30 shows characteristic impedance around 50Ω, which is substantially same with the characteristic impedance of the transmission lines, 12 to 24. Other conditions and dimensions of the marchand balun 100 of the first embodiment are the same with those of the comparable example 110 shown in FIG. 1.

Figure 5A:
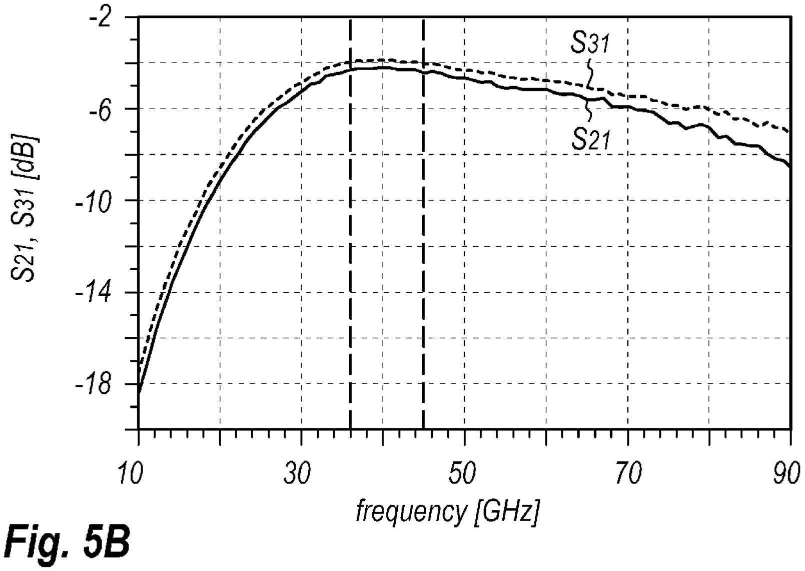
FIGS. 5A and 5B show s-parameters of $S_{21}$ and $S_{31}$ in FIG. 5A and $S_{11}$ in FIG. 5B of the marchand balun according to the first embodiment of the present invention.
Figure 5B:
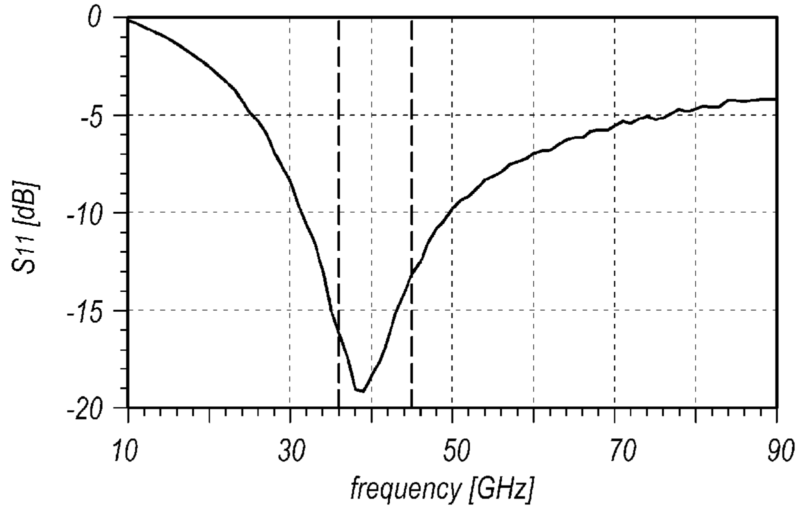

FIGS. 5A and 5B shows S-parameters, $S_{21}$, $S_{31}$, and $S_{11}$, of the marchand balun 100 shown in FIG. 4. The marchand balun 100 of the embodiment indicates the transmission, $S_{21}$ and $S_{31}$, in FIG. 5A, which are comparable with those of the comparable example shown in FIG. 3A but shows the improved reflection $S_{11}$ in FIG. 5B. Also, the marchand balun 100 may improve the reflection $S_{11}$ in lower frequencies around 35 GHz, namely, $S_{11}$ becomes smaller than −15 dB in frequencies of 35 to 45 GHz.

Figure 6:
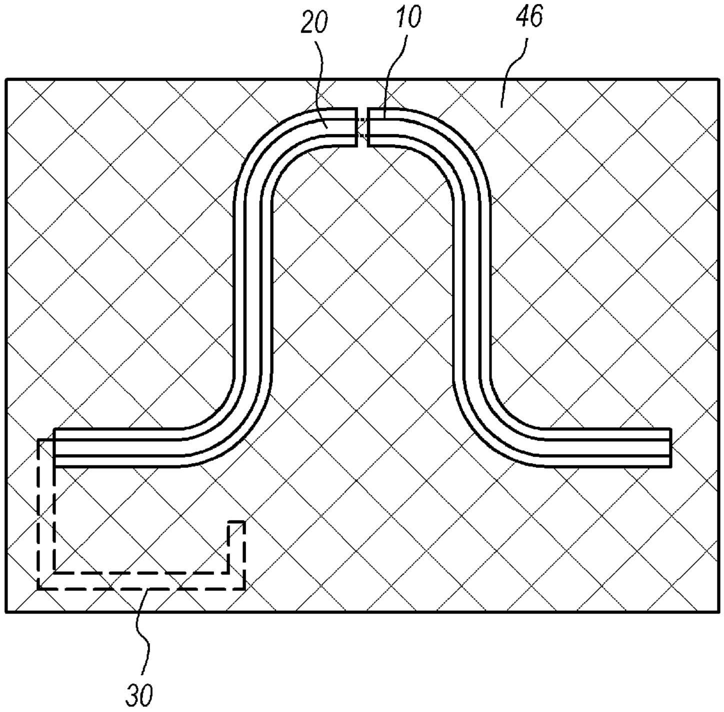
FIG. 6 shows a plane shape of the marchand balun of the first embodiment.

Next, the marchand balun 100 of the first embodiment is practically formed and evaluated in the performance thereof. FIG. 6 is a plan view of the marchand balun 100 of the first embodiment. FIG. 6 illustrates only the top metal film 46, the coupling units, 10 and 20, and the additional transmission line 30 but omits other elements appearing in FIG. 2. The marchand balun 100 of the first embodiment in the coupling units, 10 and 20, thereof, as FIG. 6 illustrates, has the plane shape of a horseshoe, or a Ω-character. The additional transmission line 30 is a type of a micro-strip line covered with the top metal film 46. The marchand balun 100 shown in FIG. 6 provides the insulating layer 48 made of polyimide with a dielectric constant of about 3, and other two meal layers, 42 and 44. Two coupling units, 10 and 20, in one of metal layers, 42 and 44, therein form a gap of about 10 μm therebetween, which is enough shorter than the lengths, $L_1$ and $L_2$, while the other of the metal layers, 42 and 44, are directly connected to form the node $N_1$ thereof. In the present embodiment, the lower metal layer 42 is common in the two units, 10 and 20, while, the upper metal layer 44 makes a gap of 10 μm between two units, 10 and 20. Thus, the metal layer, 12 or 22, connecting two coupling units, 10 and 20, gives substantially no influence for the signal transmission between the coupling units, 10 and 20.

Figure 7A:
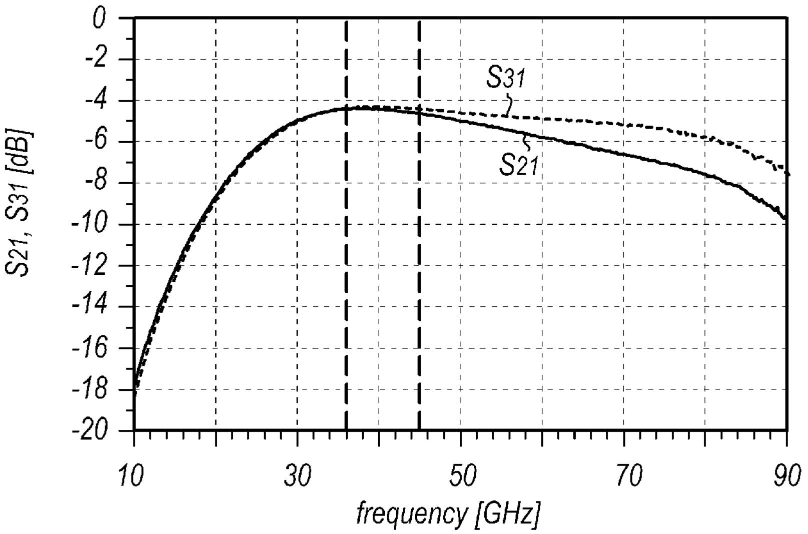
FIGS. 7A and 7B show s-parameters of $S_{21}$ and $S_{31}$ in FIG. 7A and $S_{11}$ in FIG. 7B measured in the marchand balun shown in FIG. 6.
Figure 7B:
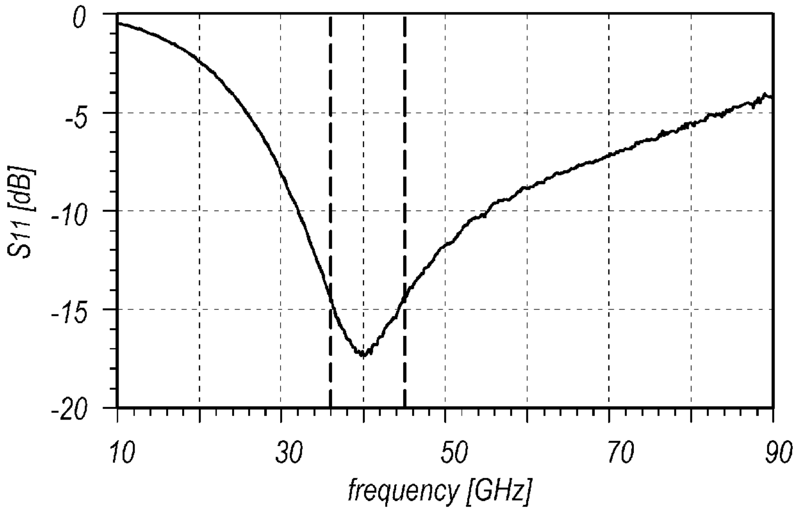

FIGS. 7A and 7B show the transmission, $S_{21}$ and $S_{31}$, and the reflection $S_{11}$ of the marchand balun 100, which are practically measure by the arrangement shown in FIG. 6. The transmission, $S_{21}$ and $S_{31}$, show relatively improved loss of −4 to −5 dB in the range of 35 to 45 GHz, compared with those shown in FIG. 5A, while the reflection $S_{11}$ lowers −15 dB in the same frequency range. Thus, the marchand balun 100 shown in FIG. 6 may compact the dimensions thereof by the transmission lines, 12 to 24, with the length of λ/8 for the subject frequency without degrading the reflection $S_{11}$ because of the existence of the additional transmission line 30 in the open terminal $T_4$.

Figure 8A:
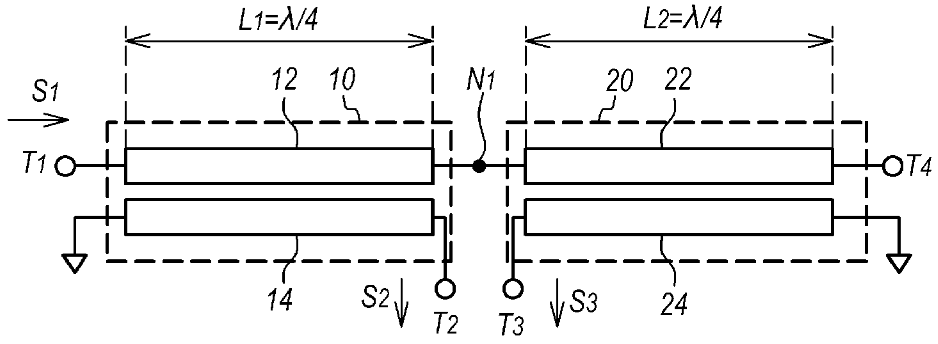
FIG. 8A is a schematic illustration of the marchand balun of the comparable example, which copies FIG. 1.
Figure 8B:
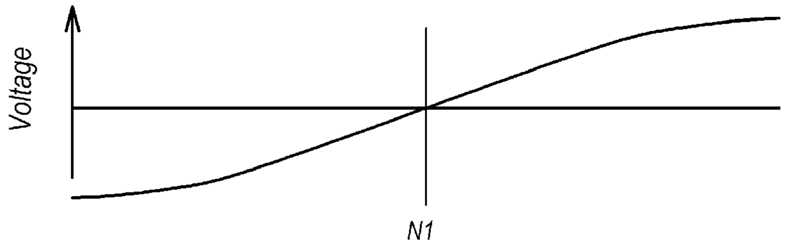
FIG. 8B shows potential distribution or voltage distribution within the transmission lines.

Next, reasons not to degrade the reflection $S_{11}$ will be explained. FIG. 8A is a schematic illustration of the marchand balun 110 of the comparable example, which copies FIG. 1, and FIG. 8B shows potential distribution or voltage distribution within the transmission lines, 12 and 22. Because the transmission lines, 12 to 24, in the coupling units, 10 and 20 have a quarter wavelength λ/4 for the specific frequency; the potential distribution at the terminals, $T_1$ and $T_4$, become complimentary to each other as shown in FIG. 8B, when a signal $S_1$ enters the unbalanced terminal $T_1$ and a signal $S_3$ outputs from the balanced terminal $T_3$.

Figure 9A:
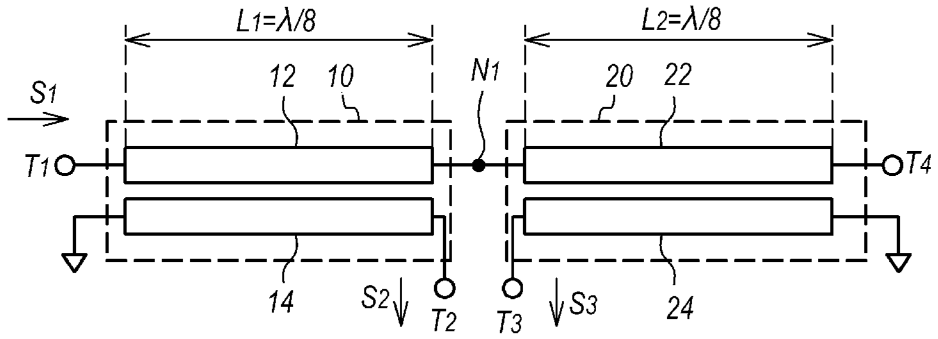
FIG. 9A schematically shows the marchand balun 110 of the comparable example but the lengths of the respective transmission lines in the coupling units are λ/8 of the RF signal under consideration.
Figure 9B:
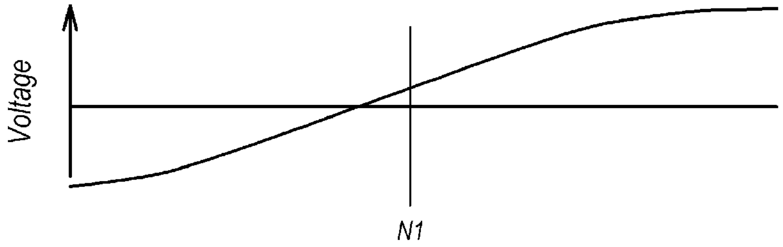
FIG. 9B shows the potential distribution in the transmission lines in the first and second coupling units.

FIG. 9A Schematically shows the marchand balun 110 of the comparable example but the lengths of the respective transmission lines, 12 to 24, in the coupling units, 10 and 20, are λ/8 of the signal subject to the marchand balun 110 under consideration; and FIG. 9B shows the potential distribution in the transmission lines, 12 and 22, in the first and second coupling units, 10 and 20. Similar to those shown in FIG. 8B, the marchand balun shown in FIG. 9A operate so as to induce the voltages appearing in the terminals, $T_1$ and $T_4$, in complementary to each other. However, because the length between the terminals, $T_1$ and $T_4$, is λ/4, a signal reflected at the terminal $T_4$ does not set the center node $N_1$ to be zero. A node at which the voltage distribution becomes zero shifts towards the terminal $T_1$ as FIG. 9B indicates. Thus, the potential distribution becomes unbalance within the coupling units, 10 and 20, and the signal entering at the unbalanced terminal $T_1$ propagates bias within the coupling units, 10 and 20, which possibly degrades the reflection $S_{11}$ at the unbalanced terminal $T_1$. Thus, the transmission lines, 12 to 24, in the coupling units, 10 and 20 with the specific length of λ/8 may degrade the reflection $S_{11}$ at the unbalanced terminal $T_1$.

Figure 10A:
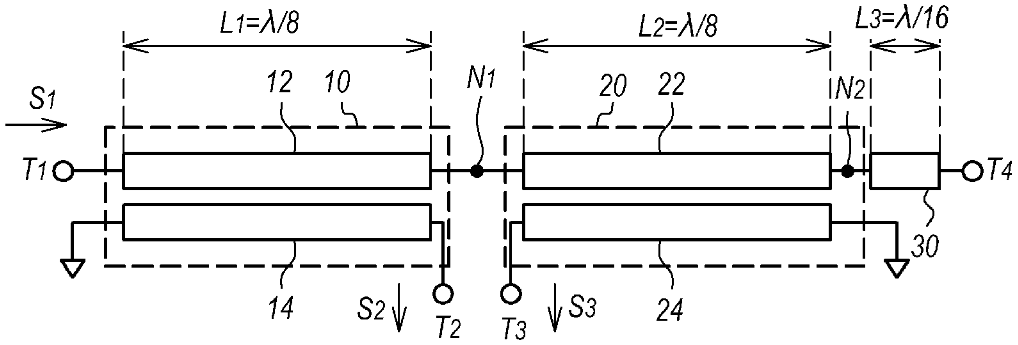
FIG. 10A schematically illustrates the marchand balun according to the embodiment of the present invention.
Figure 10B:
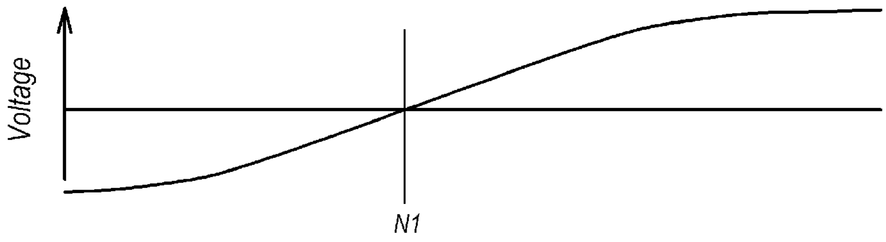
FIG. 10B shows the potential distribution within the transmission lines in the coupling units.

FIG. 10A schematically illustrates the marchand balun according to the first embodiment of the present invention, and FIG. 10B shows the potential distribution within the transmission lines, 12 and 22, in the coupling units, 10 and 20. The marchand balun 100 of the first embodiment has a feature that the transmission lines, 12 to 24, have the specific length of λ/8 and the transmission line 22 in the coupling unit 20 accompanies with the additional transmission line 30 with a length of λ/16. Similar to the aforementioned marchand baluns 110, the coupling units, 10 and 20, operates so as to set the status at the unbalanced terminal $T_1$ and the node $N_2$ complementary to each other. Moreover, a length starting at the node $N_2$, reflected at the terminal $T_4$, and reaching the other node $N_1$ becomes λ/4 (=1/16+1/16+1/8). Accordingly, the signal reflected at the terminal $T_4$ may form a knot at the node $N_1$, which means the potential distribution also forms the knot at the node $N_1$. The signal entering the unbalanced terminal $T_1$ may propagate within the coupling units, 10 and 20, as causing no disarrangement and the balanced signals, $S_2$ and $S_3$, complementary to each other may be output from the balanced terminals, $T_2$ and $T_3$, which also improves the signal reflection at the unbalanced terminal $T_1$.

Figure 11:
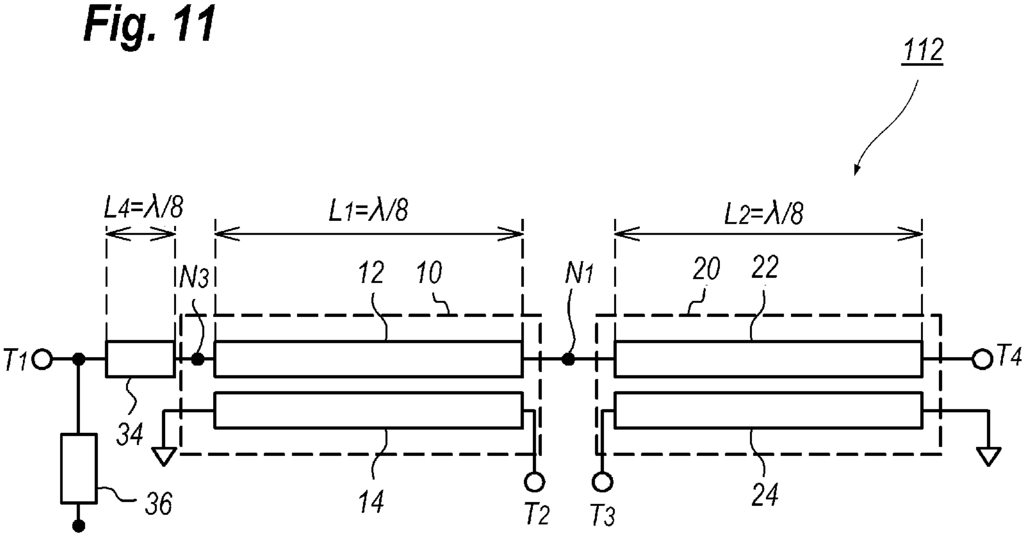
FIG. 11 schematically illustrates still another marchand balun according to the second example comparable to the embodiment of the present invention.

FIG. 11 schematically illustrates still another marchand balun 112 according to the second example comparable to the embodiment shown in FIG. 4. The marchand balun 112 provides an additional transmission line 34 with a length $L_4$ which corresponds to λ/8 at the unbalanced terminal $T_1$; that is, between the unbalanced terminal $T_1$ and the node $N_3$. The marchand balun 112 further provides an open stub 36 at the unbalanced terminal $T_1$ with a length of λ/16. The marchand balun shown in FIG. 11 shows the transmission and reflection characteristics illustrated in FIGS. 12A and 12B, respectively.

Figure 12A:
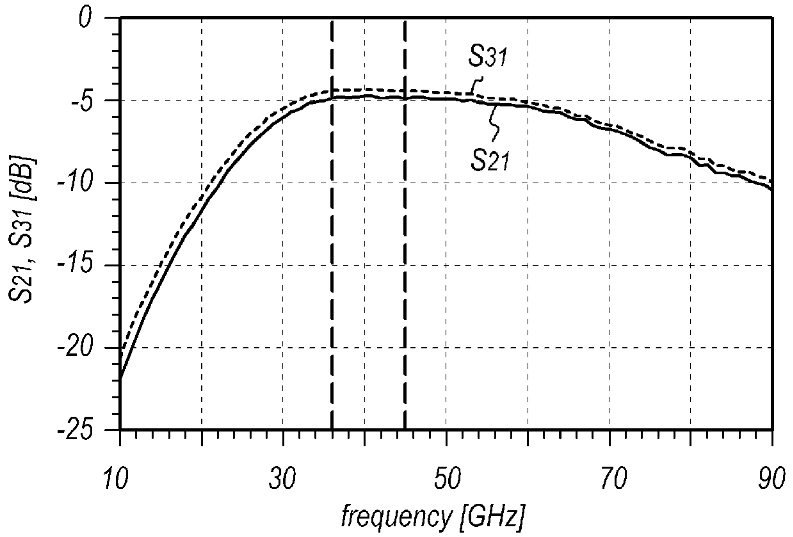
Figure 12B:
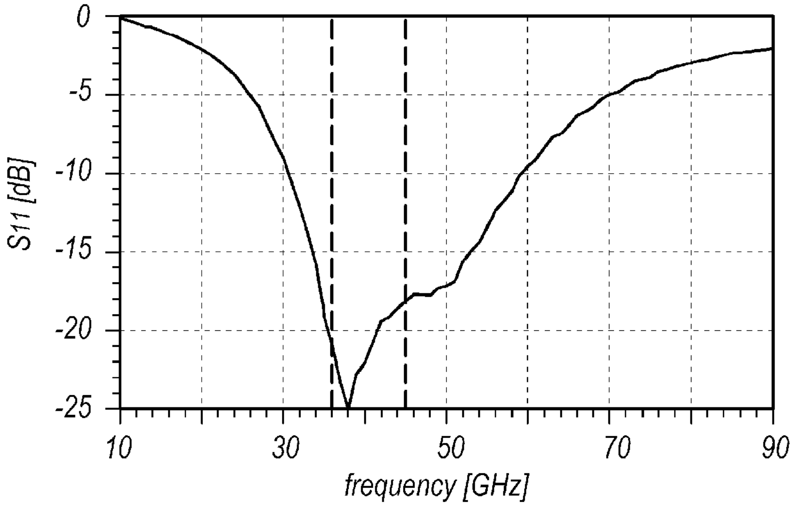
FIG. 12B shows a reflection characteristic thereof at the unbalanced terminal.

FIG. 12A shows transmission, $S_{21}$ and $S_{31}$, of the marchand balun 112 of the second comparable example, while, FIG. 12B shows reflection $S_{11}$ thereof at the unbalanced terminal $T_1$. As FIG. 12A explicitly indicates, the transmission, $S_{21}$ and $S_{31}$, show relatively restricted losses in frequencies of 35 to 45 GHz; specifically, the losses become about −5 dB. Also, the reflection $S_{11}$ at the unbalanced terminal $T_1$ shows smaller than −15 dB, which is comparable to those obtained in the marchand balun 100 of the first embodiment. However, the second comparable example shown in FIG. 11 provides the open stub 36 that probably expands an area or a plane size of the device.

According to the first embodiment shown in FIG. 4, the transmission line 12 in the first coupling unit 10 is terminated in the node $N_1$ and the unbalanced terminal $T_1$ in the respective ends thereof; while, the transmission line 14 also in the first coupling unit 14 in the respective ends thereof are terminated with the one of the balanced terminals $T_2$ and the ground. The transmission lines, 22 and 24, in the second coupling unit 20 are terminated in the respective ends thereof to the nodes, $N_1$ and $N_2$, and the other of the balanced terminals $T_3$ and the ground. The additional transmission line 30 is connected to the terminal $T_4$ in one ends thereof and opened in the other end. Moreover, the transmission lines, 12 to 24, in the first and second coupling units, 10 and 20, have the length of λ/8 for the signal subject to the marchand balun 100 of the present embodiment, which are half of those of the conventional marchand balun 110 shown in FIG. 1 and may form the device compact. The additional transmission line 30 may set the node $N_1$ between two coupling units, 10 and 20, to be a knot in the potential distribution, which may restrict the losses in the transmission, $S_{21}$ and $S_{31}$, and the reflection $S_{11}$ at the balanced terminal $T_1$. Thus, the additional transmission line 30 may set the transmission and reflection performance of the device and the size thereof to be compact.

In an alternative, the coupling units, 10 and 20, may have lengths, $L_1$ and $L_2$, of λ/16 to 3λ/16, where λ is a wavelength of the signal subject to the marchand balun 100 of the embodiment. Even the coupling units, 10 and 20, have such a length, the coupling units, 10 and 20, may be collectively operable as a marchand balun. Further preferably, the coupling units, 10 and 20, may have lengths, $L_1$ and $L_2$, of 3λ/32 to 5λ/32.

The additional transmission line 30 may have the length $L_3$ of λ/16 in order to suppress the reflection $S_{11}$ at the unbalanced terminal $S_1$ as described in FIGS. 10A and 10B. Further preferably, the additional transmission line 30 may have a length $L_3$ longer than λ/32 but shorter than 3λ/32, or still further preferably longer than 3λ/64 but shorter than 5λ/64.

In order to operate the coupling units, 10 and 20, as a marchand balun, the coupling units, 10 and 20, preferably have lengths, $L_1$ and $L_2$, substantially equal to each other. The transmission lines, 12 and 14, in the coupling unit 10 preferably set a gap therebetween substantially constant in a whole length thereof. Also, the transmission lines, 22 and 24, in the other coupling unit 20 preferably set a gap therebetween that is substantially constant in a whole length. Moreover, the transmission lines, 12 to 24, may have characteristic impedance substantially same to each other.

As FIG. 2 indicates, the transmission lines, 12 and 14, and the transmission lines, 22 and 24 are separated by the insulating layer 48 on the substrate 40, which may precisely set the gap between the transmission lines. The lower metal layer, namely, the first metal layer 42 may form the transmission lines, 14 and 24, while, the upper metal layer, namely, the second metal layer 44, may form the other transmission lines, 12 and 22, respectively. The gap with the width $W_3$ formed right over the second metal layer 44 may weaken the coupling between the metal film 46 and the second and first metal layers, 44 and 42, which

Second Embodiment

Figure 13:
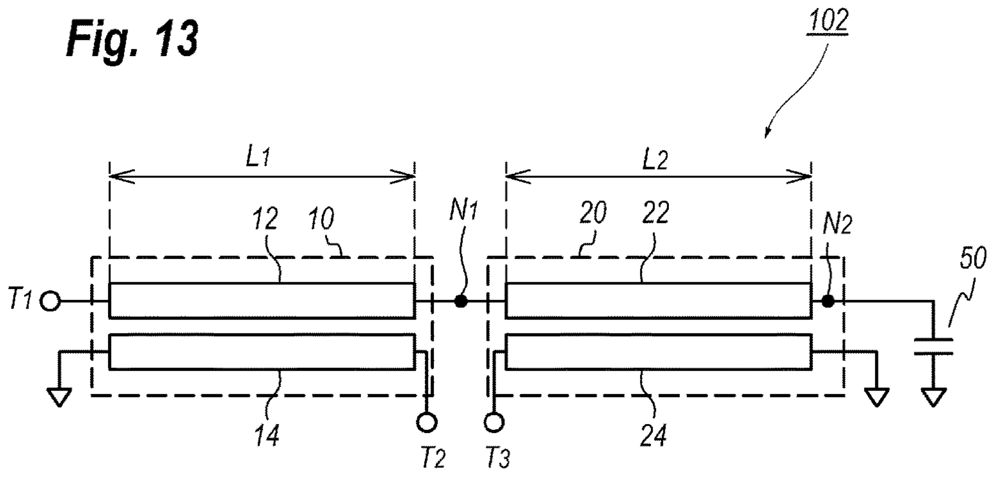
FIG. 13 schematically illustrates a marchand balun according to the second embodiment of the present invention.

FIG. 13 schematically illustrates a marchand balun according to the second embodiment of the present invention. The marchand balun 102 shown in FIG. 13 provides a capacitor 50 connected between the node $N_2$ and the ground. Similar to those of the first embodiment, the transmission lines, 12 to 24, have the characteristic lengths, $L_1$ and $L_2$, of λ/8 where the wavelength λ corresponds to the signal subject to the marchand balun 102. Other arrangements of the marchand balun 102 are same with those of the first embodiment.

Figure 14A:
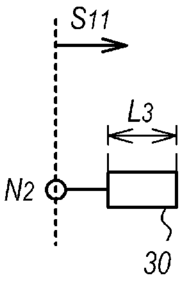
FIGS. 14A and 14B show equivalent circuits of the additional transmission line and the capacitor subject to the evaluation of the marchand balun of the present invention.
Figure 14B:
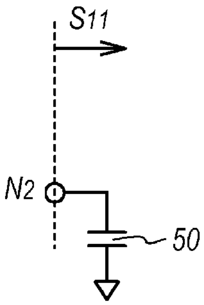

Evaluating the reflection $S_{11}$ of the additional transmission line 30 and the capacitor 50 viewed from the node $N_2$, FIGS. 14A and 14B show equivalent circuits of the additional transmission line 30 and the capacitor 50 subject to the evaluation of the marchand balun of the present invention. FIG. 14A corresponds to the additional transmission line 30 operating as an open stub, where the additional transmission line 30 provides a length $L_3$ of λ/13 and a width of 10 μm, where the wavelength λ corresponds to the signal with a frequency of 40 GHz. On the other hand, the capacitor 50 with capacitance of 0.026 pF is directly connected to the node $N_2$.

Figure 15A:
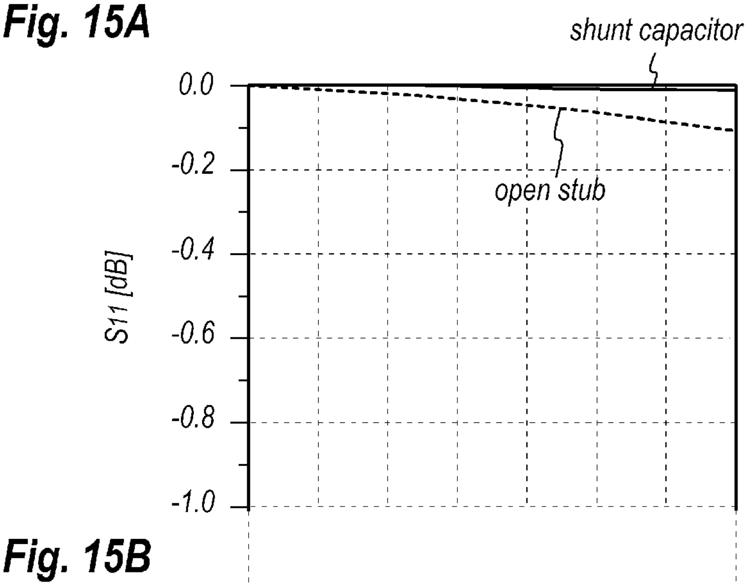
Figure 15B:
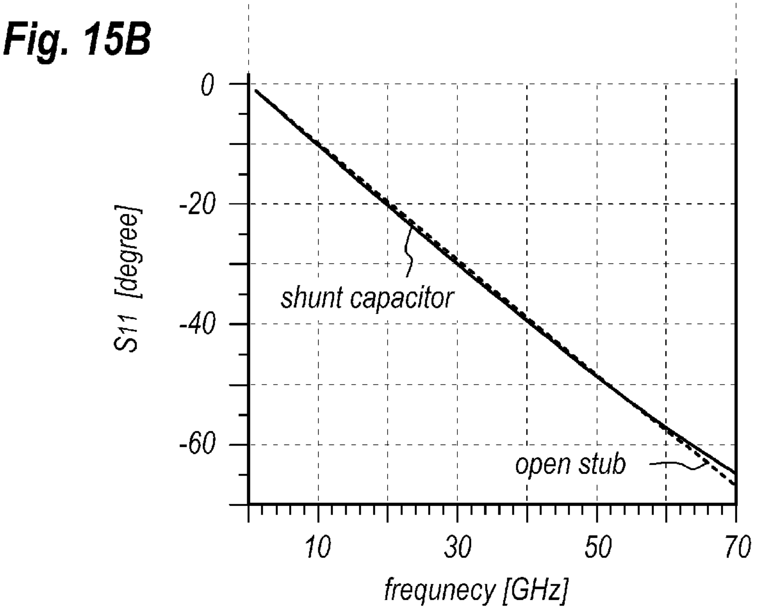
FIG. 15B shows phases of the reflection $S_{11}$.

FIG. 15A compares magnitudes of the reflection $S_{11}$ at the unbalanced terminal $T_1$, while, FIG. 15B compares phases of the reflection $S_{11}$. As shown in FIG. 15A, the open stub 50 moderately increases the loss at the node $N_2$ as the frequency increases but the capacitor shows substantially no loss even the frequency reaches 70 GHz. As to the phases, both the open stub 30 and the capacitor 50 show behaviors same to each other. Thus, replacing the open stub 50 to the capacitor 50, the loss caused thereby may be reduced without changing the phase performance.

The transmission, $S_{21}$ and $S_{31}$, and the reflection, $S_{11}$, $S_{22}$, and $S_{33}$ in the magnitudes an the phases thereof are compared in the marchand baluns, 110, 100, and 102, for conditions of:

in the comparable example 110, the lengths, $L_1$ and $L_2$, of the transmission lines, 12 to 24, are λ/4 for the frequency of 40 GHz; in the first embodiment 100, the lengths, $L_1$ and $L_2$, of the transmission lines, 12 to 24, are λ/8 and the length $L_3$ of the additional transmission line 30 is λ/13 for the frequency of 40 Go; and in the second embodiment, the lengths, 12 to 24, of the transmission lines, $L_1$ and $L_2$, are λ/8 for the frequency of 40 GHz and the capacitance of the capacitor 50 is 0.026 pF. Other conditions or dimensions of the elements are same with those assumed for FIGS. 5A and 5B.

Figure 16A:
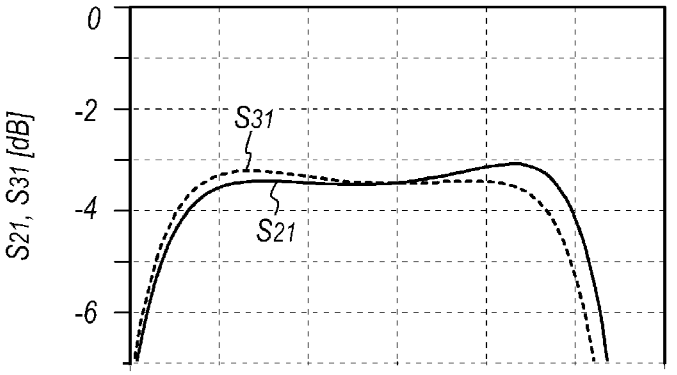
FIGS. 16A to 16C show the transmission, $S_{21}$ and $S_{31}$, in the magnitudes and in the phases thereof, and the reflection, $S_{11}$, $S_{22}$, and $S_{33}$, for the marchand balun comparable to the present invention.
Figure 16B:
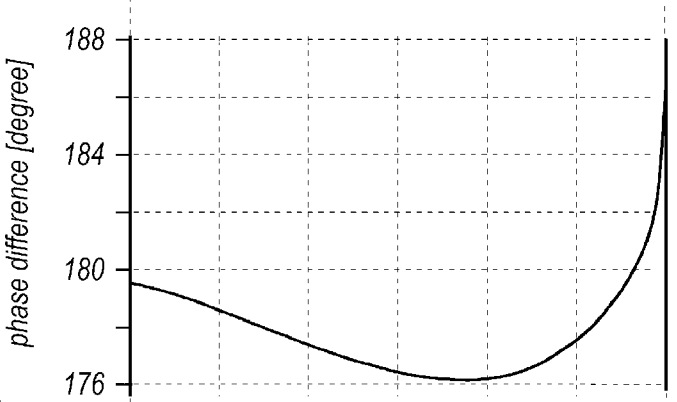
Figure 16C:
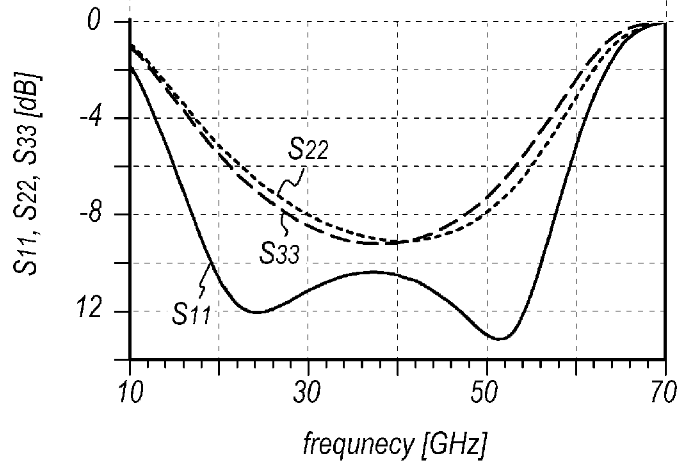

FIGS. 16A to 16C show the transmission, $S_{21}$ and $S_{31}$, in the magnitudes and in the phase difference thereof, and the reflection, $S_{11}$, $S_{22}$, and $S_{33}$, for the marchand balun 110 comparable to the present invention. As FIG. 16A indicates, the transmission, $S_{21}$ and $S_{31}$, are comparable at a frequency of 40 GHz. Also, as FIG. 16B indicates, the phase difference between the transmission, $S_{21}$ and $S_{31}$, becomes about 4°, which may be a substantial difference in a marchand balun, but the absolute thereof is almost 180° at a frequency around 40 GHz. As to the reflection, $S_{11}$ becomes less than −10 dB but the other two, $S_{22}$ and $S_{33}$, are around −9 dB at the frequency of 40 GHz, which may be also substantial in a marchand balun.

Figure 17A:
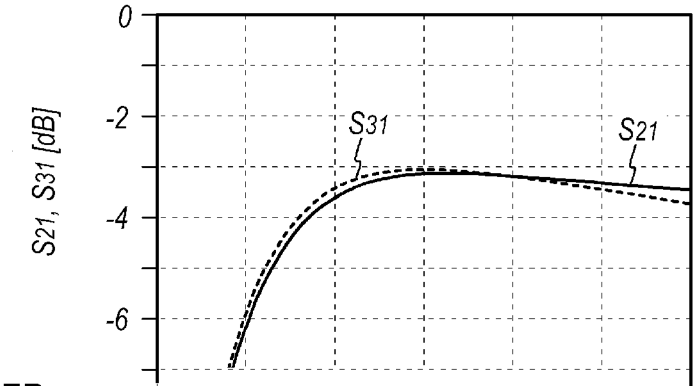
FIGS. 17A to 17C show behaviors of the transmission, $S_{21}$ and $S_{31}$, in the magnitudes thereof and in the phase difference thereof, and the reflection, $S_{11}$, $S_{22}$, and $S_{33}$, for the marchand balun according to the first embodiment.
Figure 17B:
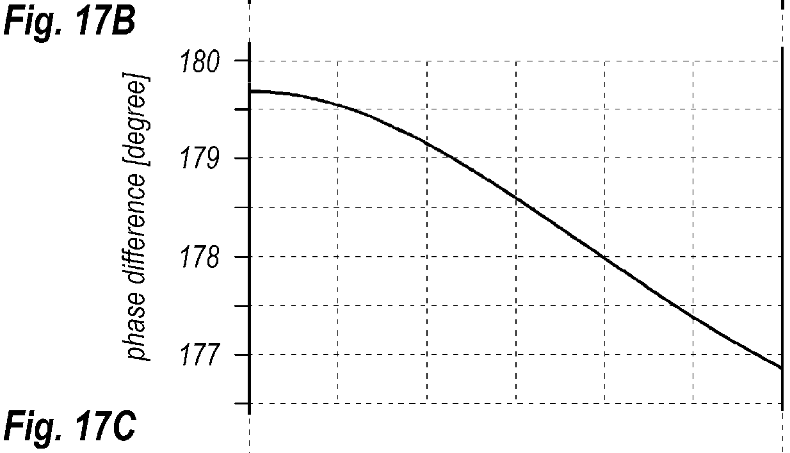
Figure 17C:
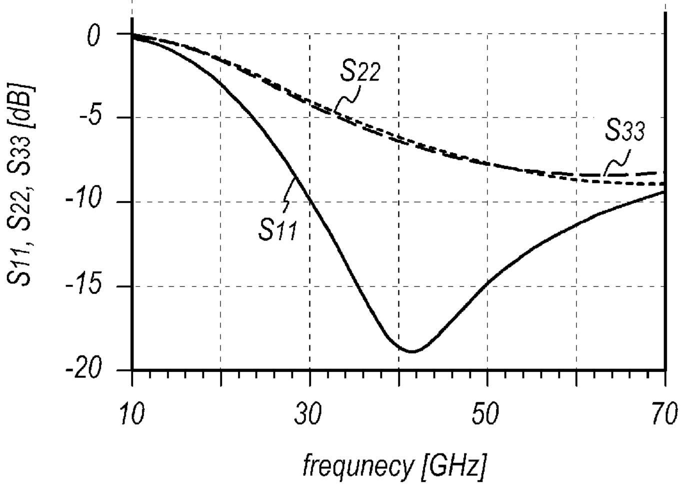

FIGS. 17A to 17C show behaviors of the transmission, $S_{21}$ and $S_{31}$, in the magnitudes thereof and in the phase difference thereof, and the reflection, $S_{11}$, $S_{22}$, and $S_{33}$, for the marchand balun 100 according to the first embodiment. The transmission, $S_{21}$ and $S_{31}$, in the magnitudes thereof are comparable around 40 GHz as FIG. 17A indicates. The phase difference between the transmission, $S_{21}$ and $S_{31}$, shows an offset of merely 1.5° from 180° at the frequency of 40 GHz. Moreover, as FIG. 17C indicates, the reflection $S_{11}$ at 40 GHz becomes less than −18 dB, which exceeds the result for the comparable example 100 shown in FIG. 16C. Thus, the marchand balun 100 of the first embodiment may show excellent performance even the lengths of the transmission lines, 12 to 14, becomes λ/8 for the frequency 40 GHz.

Figures 18A, 18B, 18C:
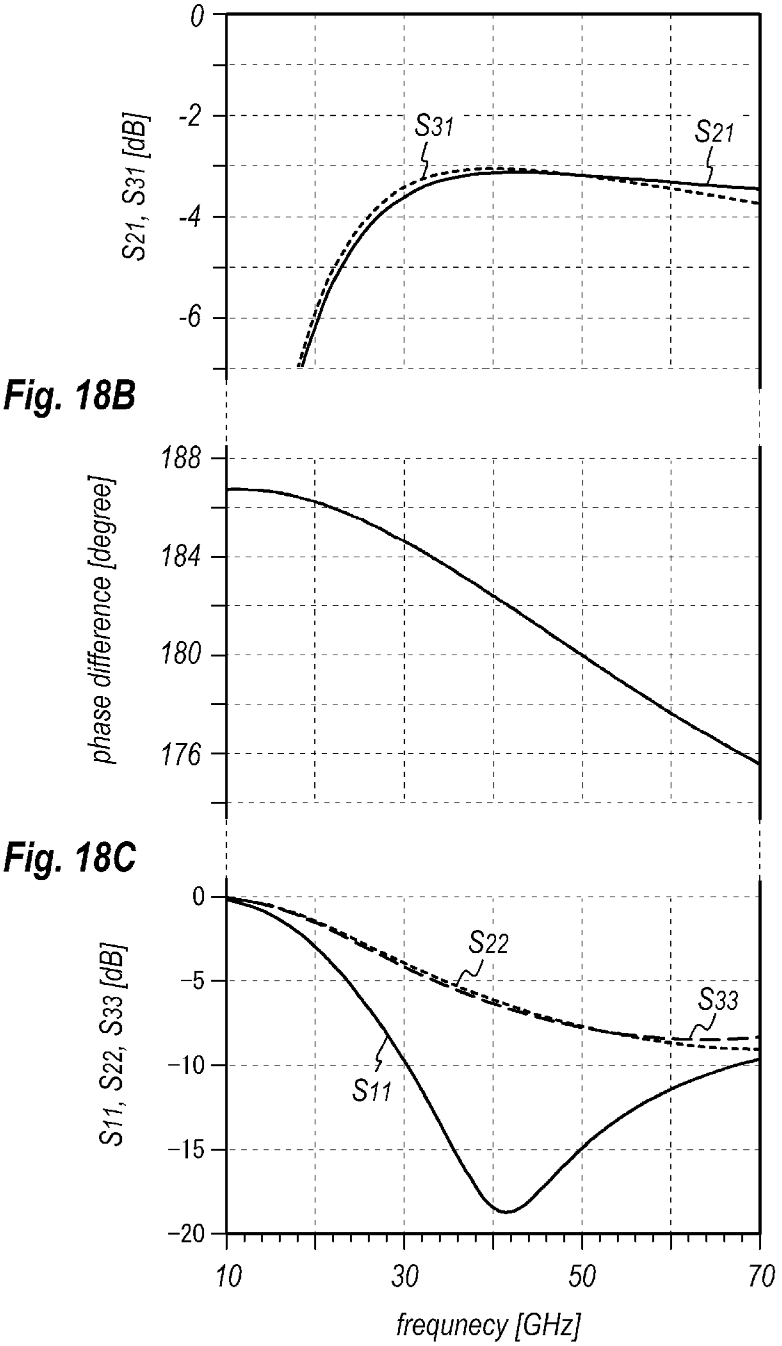
FIGS. 18A to 18C show the transmission, $S_{21}$ and $S_{31}$, in the magnitudes and that in the phase difference, and the reflection, $S_{11}$, $S_{22}$, and $S_{33}$, for the marchand balun of the second embodiment.

FIGS. 18A to 18C show the transmission, $S_{21}$ and $S_{31}$, in the magnitudes thereof and in the phase difference, and the reflection, $S_{11}$, $S_{22}$, and $S_{33}$, for the marchand balun 102 of the second embodiment. The transmission, $S_{21}$ and $S_{31}$, becomes comparable to each other at the frequency 40 GHz. Also, the transmission, $S_{21}$ and $S_{31}$, in the phase difference thereof shows an offset of merely 1.5° from 180°. Finally, the reflection $S_{11}$ becomes less than −18 dB at the frequency of 40 GHz, which is lower than that obtained in the marchand balun 100 of the first embodiment. Thus, the marchand balun 102 of the second embodiment may show the performance substantially comparable to those of the marchand balun 100 of the first embodiment.

Figure 19A:
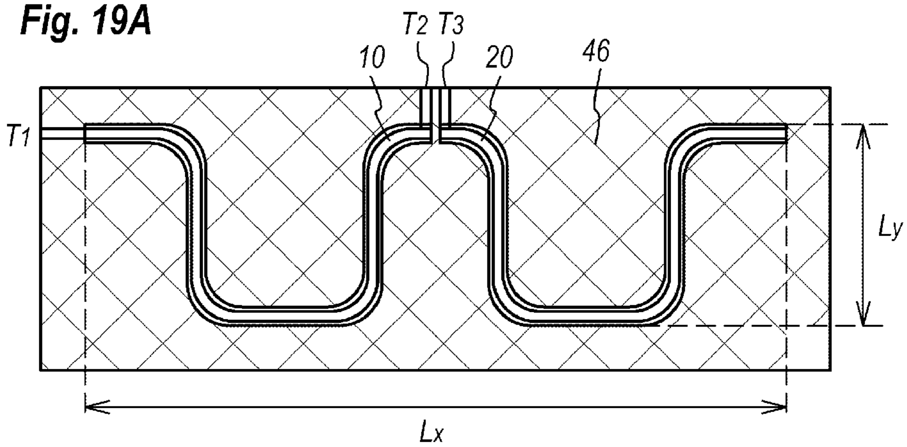
FIGS. 19A to 19C compare plan views of the marchand balun of the comparable example, the first embodiment and the second embodiment.
Figure 19B:
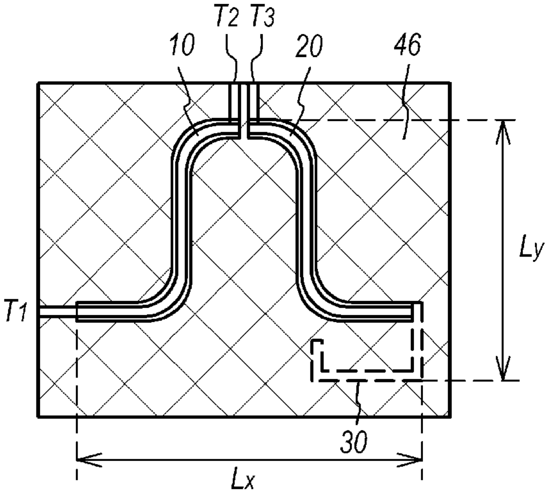
Figure 19C:
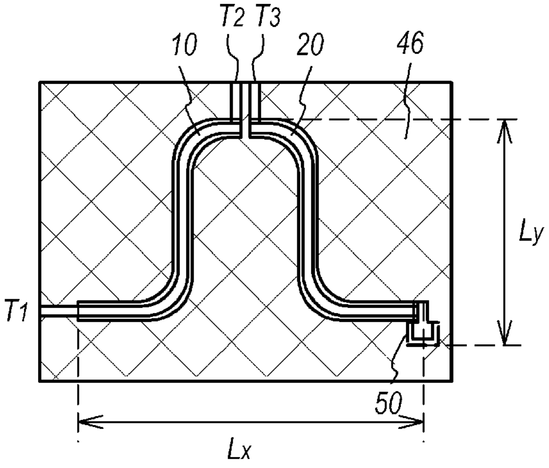

Finally, three marchand baluns, 100, 102, and 110 are compared in the plan views thereof in FIGS. 19A to 19C, where FIGS. 19A to 19C show plan views of the marchand baluns according to the comparable example, the first embodiment, and second embodiment, respectively. FIGS. 19A to 19C only show the top metal film 46, the coupling units, 10 and 20, the additional transmission line 30, and the capacitor 50.

In the comparable example shown in FIG. 19A, because the coupling units, 10 and 20, have the length of λ/4, the plane size of the marchand balun 110 becomes 930×300 $\mu m^2$. Because the marchand balun 100 according to the first embodiment has the coupling units, 10 and 20, with the length of λ/8, the plane size thereof becomes 480×360 $\mu m^2$ even the marchand balun 100 additionally provides the additional transmission line 30 with the specific length of λ/13 to λ/16. The marchand balun 102 of the second embodiment has the plane size of merely 480×320 $\mu m^2$ because the device 102 replaces the additional transmission line 30 with the capacitor 50.

A capacitor inherently shows impedance of $Z=1/j\omega C$, where $\omega=2\pi f$ and f is a frequency of a signal subject to the capacitor and C is capacitance of the capacitor. When the capacitor 50 replaced from the additional transmission line 30 in the second embodiment, the capacitor 50 preferably shows impedance of −120 j to −140 j, or further preferably −125 j to −135 j.

The foregoing descriptions of specific embodiment of the present invention have been presented for purposes of illustration and description. They are not intended to be exhaustive or to limit the invention to the precise forms disclosed, and many modifications and variations are obviously possible in light of the above teaching. The embodiment was chosen and described in order to best explain the principles of the invention and its practical application; thereby to enable others skilled in the art to best utilize the invention and the embodiment with various modifications as are suited to the particular use contemplated. Therefore, it is intended that the scope of the invention be defined by the claims appended hereto and their equivalents.

The present application claims the benefit of priority of Japanese Patent Applications No. 2016-036215, filed on Feb. 26, 2016, and 2016-205865, filed on Oct. 20, 2016, which are incorporated herein by reference.

What is claimed is:

1. A marchand balun that provides an un-balanced terminal and two balanced terminals, the marchand balun converting a signal with a specific wavelength of λ between a un-balanced mode at the un-balanced terminal and a balanced mode at the balanced terminals, the marchand balun comprising:

a first coupling unit that includes a first transmission line and a second transmission line coupled with the first transmission line, the first transmission line having an end and another end, the end being connected to the un-balanced terminal, the second transmission line having a grounded end and another end connected to one of the balanced terminals;

a second coupling unit that includes a third transmission line and a fourth transmission line coupled with the third transmission line, the third transmission line having an end and another end, the end of the third transmission line being connected to the another end of the first transmission line, the fourth transmission line having a grounded end and another end connected to another of the balanced terminals;

an additional unit having an end connected to the another end of the third transmission line;

a substrate;

an insulating layer provided on the substrate, the insulating layer having a first layer, a second layer, and a third layer, the second layer including a metal layer that forms the first transmission line and the third transmission line, the third layer including another metal layer that forms the second transmission line and the fourth transmission line, the another metal layer overlapping with the metal layer; and a metal film provided on the insulating layer, the metal film having a gap in a position overlapping with the metal layer and the another metal layer, the metal film being grounded, wherein the first to fourth transmission lines in the first coupling unit and the second coupling unit have a length longer than λ/16 but shorter than 3λ/16.

2. The marchand balun of claim 1, wherein the additional unit includes a capacitor having one terminal connected to the end of the additional unit and another terminal being grounded.

3. The marchand balun of claim 2, wherein the capacitor has impedance of −120 j to −140 j.

4. The marchand balun of claim 1, wherein the additional unit includes an additional transmission line with a length of λ/32 to 3λ/32 between one end and another end thereof, the one end of the additional transmission line being connected to the end of the additional unit and the another end of the additional transmission line being opened.

5. The marchand balun of claim 4, wherein the another metal layer forms the additional transmission line.

6. The marchand balun of claim 5, wherein the metal film fully overlaps with the metal layer in the additional unit, and wherein the additional transmission line forms a microstrip line fully covered with the metal film.

7. The marchand balun of claim 1, wherein the substrate is made of semiconductor material.

8. The marchand balun of claim 7, wherein the semiconductor material includes gallium arsenide (GaAs).

9. The marchand balun of claim 1, wherein the metal layer has a width wider than a width of the another metal layer.

10. The marchand balun of claim 1, wherein the first transmission line and the second transmission line in the first coupling unit, and the third transmission line and the fourth transmission line in the second coupling unit collectively form a horseshoe plane shape.

* * * * *